United States Patent [19]
Abe

[11] Patent Number: 5,849,608
[45] Date of Patent: Dec. 15, 1998

[54] SEMICONDUCTOR CHIP PACKAGE

[75] Inventor: Masaaki Abe, Kumamoto, Japan

[73] Assignee: NEC Corporation, Japan

[21] Appl. No.: 865,495

[22] Filed: May 29, 1997

[30] Foreign Application Priority Data

May 30, 1996 [JP] Japan .................................. 8-137149

[51] Int. Cl.⁶ ........................... H01L 21/44; H01L 21/48; H01L 21/50
[52] U.S. Cl. .......................... 438/123; 438/612; 438/613; 257/666; 257/673; 257/676; 257/737; 257/738; 29/180.21; 29/180.22
[58] Field of Search ..................... 438/118, 123, 438/125, 126, 612–617, 377, 343, 380, 369; 257/737, 738, 666, 673, 676, 774; 29/180.21, 180.22

Primary Examiner—John Niebling
Assistant Examiner—David A. Zarneke

[57] ABSTRACT

A semiconductor chip package is produced using a lead frame which has an island where a plurality of through holes are formed corresponding to the electrodes of the semiconductor chip, respectively. After an insulating film is formed on the island, the semiconductor chip is fixed to one side of the island through an adhesive layer while aligning the electrodes of the semiconductor chip with the through holes of the island portion, respectively. After sealing the semiconductor chip with sealing resin, solder balls are formed on the other side of the island portion, the solder balls are connected to the electrodes of the semiconductor chip through the through holes of the island portion, respectively.

13 Claims, 3 Drawing Sheets

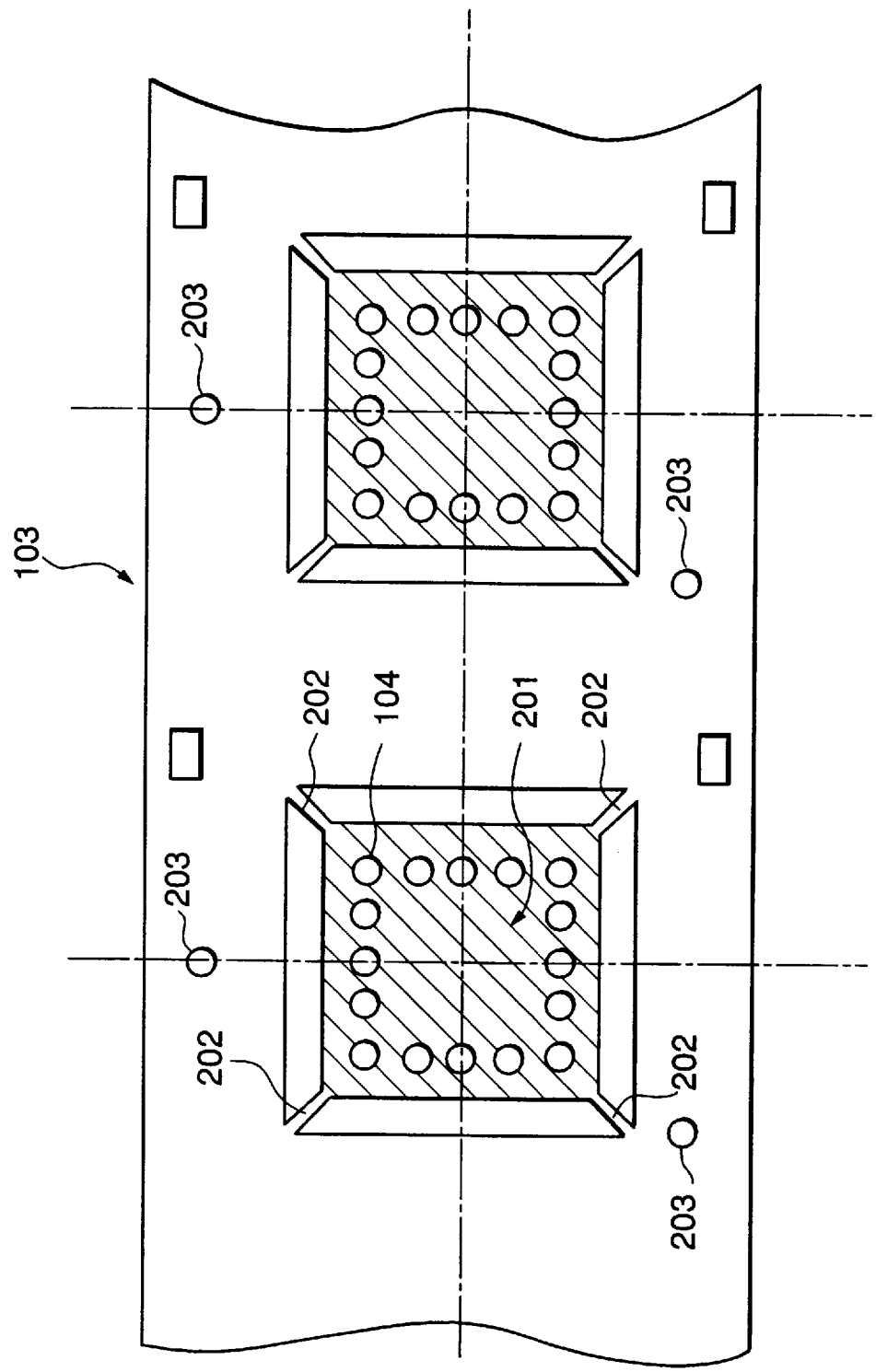

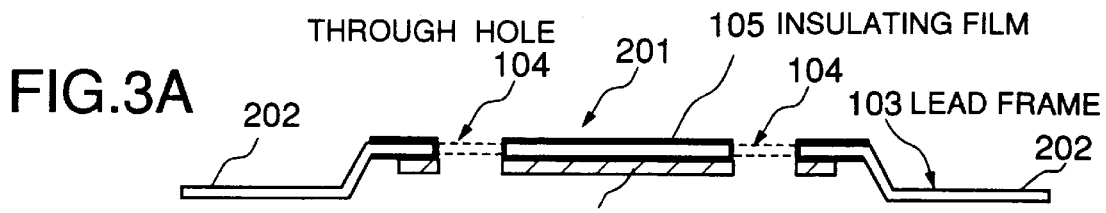
FIG.3A
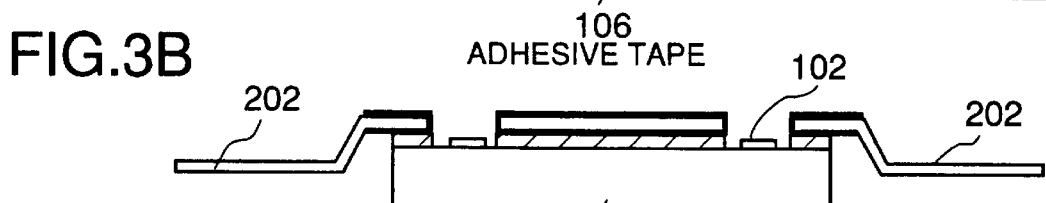
FIG.3B
FIG.3C
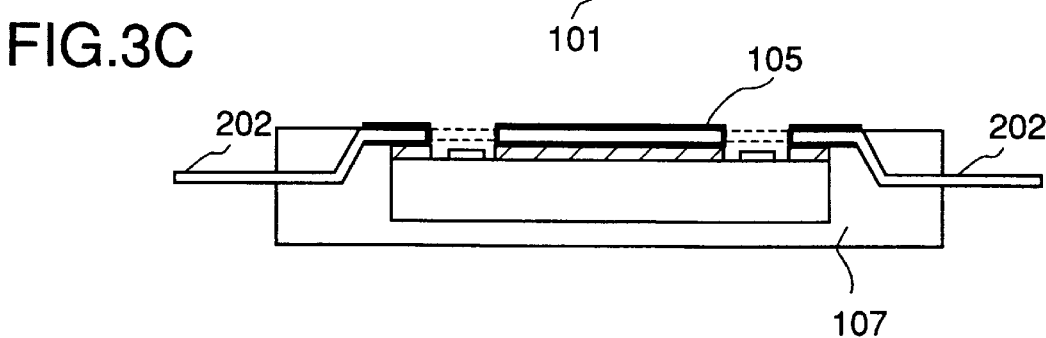
FIG.3D
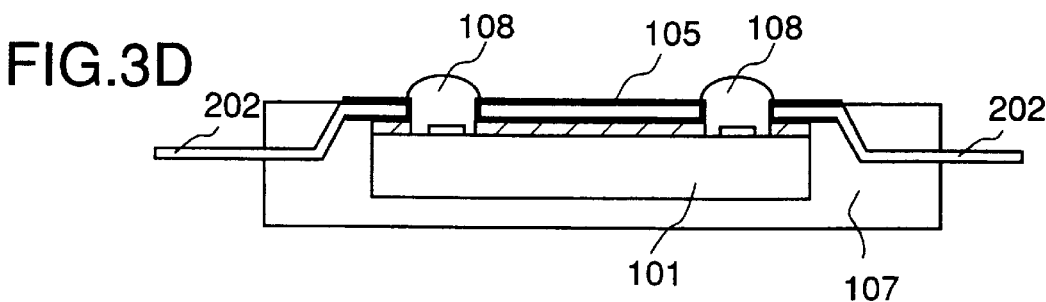
FIG.3E
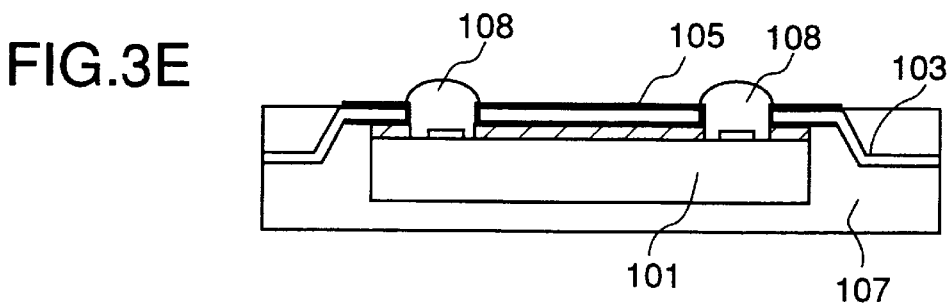

SEMICONDUCTOR CHIP PACKAGE

BACKGROUND OF THE INVENTION

1. Field of the Invention

The present invention relates to a method of producing a semiconductor chip package having a solder ball array thereon.

2. Description of the Related Art

In recent years, for the high integration and large capacity of an IC chip, especially for LSI and VLSI chips, packages for mounting a semiconductor chip are reduced in size and have a great number of pins, and the spacing between leads on the lead frame has become narrower and narrower. In the case where such a semiconductor chip is packaged, there is adopted plastic BGA (ball grid array) which is a surface-mount package where the semiconductor chip is sealed with resin on a substrate having an array of solder balls which are connected to the electrodes of the semiconductor chip, respectively.

However, the conventional package has employed a multi-layer substrate. Therefore, an assembly line for lead frames cannot be used to produce the conventional package. In other words, in order to fabricate the conventional multi-layer package, a new assembly line for multi-layer substrates is needed. Especially, the multi-layer substrate includes relatively expensive material such as ceramics, resulting in increased cost for a chip package.

SUMMARY OF THE INVENTION

Accordingly, it is an object of the present invention to provide a chip package and a method of producing the chip package with improved productivity and reduced cost.

Another object of the present invention is to provide a method of producing a chip package using a lead frame.

According to an aspect of the present invention, after insulating a metal film having an island portion where a plurality of through holes are formed corresponding to the electrodes of a semiconductor chip, respectively, such that at least the island portion having the through holes therein is insulated, the semiconductor chip is bonded to one side of the island portion such that the electrodes of the semiconductor chip are aligned with the through holes of the island portion, respectively. Thereafter, a plurality of terminals are formed on the other side of the island portion, the terminals being connected to the electrodes of the semiconductor chip through the through holes of the island portion, respectively.

According to another aspect of the present invention, first, a lead frame is prepared which has an island portion where a plurality of through holes are formed corresponding to the electrodes of the semiconductor chip, respectively. On at least the island portion having the through holes therein, an insulating film is formed. Subsequently, the semiconductor chip is fixed to one side of the island portion of the lead frame through an adhesive layer such that the electrodes of the semiconductor chip are aligned with the through holes of the island portion, respectively. After sealing the semiconductor chip with sealing resin, a plurality of terminals are formed on the other side of the island portion, the terminals being connected to the electrodes of the semiconductor chip through the through holes of the island portion, respectively.

Since the metal film is used as a substrate mounting the semiconductor chip thereon instead of multi-layer substrate, the production process is simplified and the production cost is reduced. Further, since the lead frame is used as a substrate mounting the semiconductor chip thereon, the conventional production line for lead frames can be used, resulting in more improved productivity and reduced cost for a chip package.

BRIEF DESCRIPTION OF THE DRAWINGS

The present invention will be described in further detail with reference to the accompanying drawings, in which:

FIG. 2 is a plan view showing a part of a lead frame used in the embodiment; and FIGS. 3A–3E are sectional views used to explain a producing method of the plastic BGA package according to an embodiment of the present invention.

DETAILED DESCRIPTION OF THE PREFERRED EMBODIMENTS

Figure 1A:
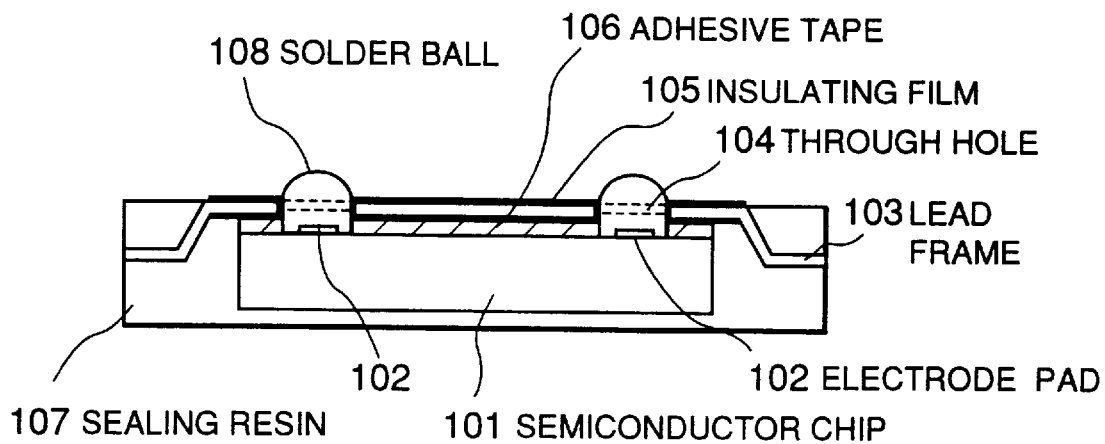
FIG. 1A is a diagram showing the sectional structure of a plastic BGA package according to an embodiment of the present invention.
Figure 1B:
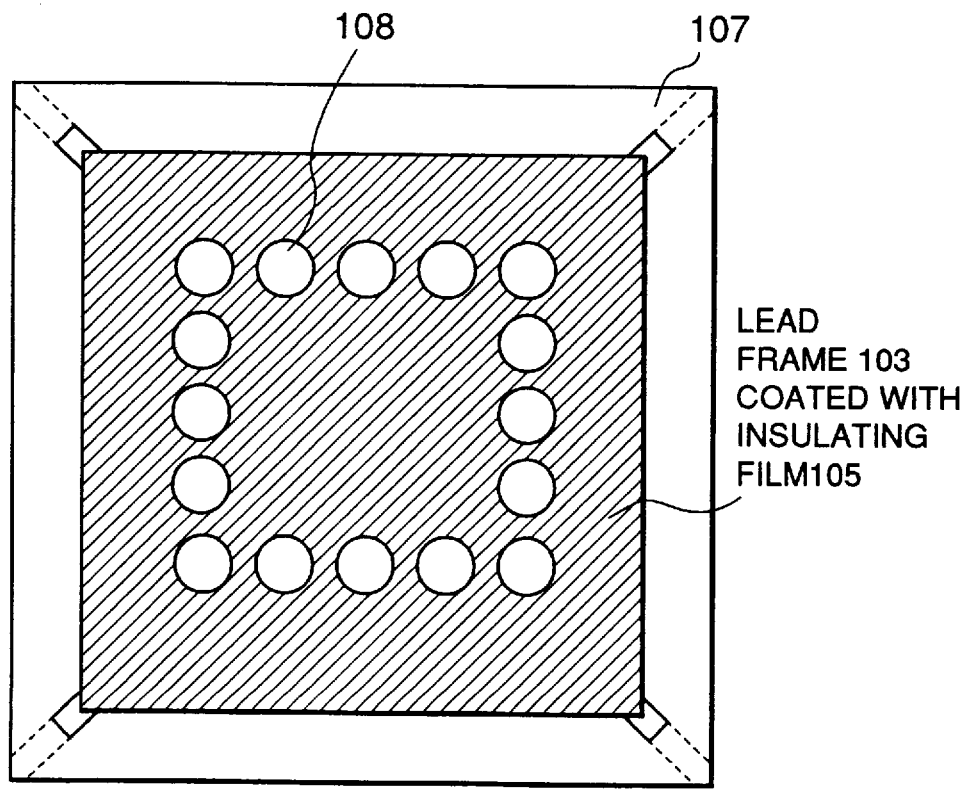
FIG. 1B is a plan view showing the plastic BGA package according to the embodiment.

Referring to FIGS. 1A and 1B, a semiconductor chip 101 is provided with a predetermined number of electrodes 102 arrayed in a predetermined pattern on one side thereof.

A lead frame 103 includes a square island for mounting the semiconductor chip 101. The island has the predetermined number of through holes 104 corresponding to the electrodes 102 of the semiconductor chip 101, respectively. Further, at least the island and the through holes 104 therein are coated with insulating film 105. In this embodiment, the island coated with the insulating film 105 is shown by the diagonal shaded area in FIG. 1B.

The semiconductor chip 101 is pressed and fixed to the island of the lead frame 103 through an adhesive tape 106 such that the electrodes 102 of the semiconductor chip 101 are aligned with the through holes 104 in the island of the lead frame 103. The semiconductor chip 101 and the lead frame 103 are sealed with resin 107. Thereafter, the respective through holes 102 are filled with solder to form solder balls 108 which are electrically connected to the electrodes 102. Thus, a plastic BGA package having the lead frame therein is produced.

The details of production steps of the plastic BGA package will be described hereinafter.

As shown in FIG. 2, a plurality of lead frame patterns are formed in a metal film made of, for example, copper (Cu) or alloys of copper. As described above, a lead frame pattern includes a square island 201 for mounting the semiconductor chip 101. The island 201 is supported by supporting pins 202 located at the four corners of the island 201. Further, the predetermined number of through holes 104 are opened in the island 201 with corresponding to the electrodes 102 of the semiconductor chip 101, respectively. Furthermore, the surfaces of the island 201 and the side walls of the through holes 104 therein are coated with the insulating film 105 such as polyimide base material. The lead frame 103 is further provided with positioning holes 203 for each lead frame pattern. The lead frame 103 like this is used to produce the plastic BGA package as shown in FIGS. 3A–3E.

Referring to FIG. 3A, after bending the four supporting pins 202, the adhesive tape 106 is attached to the island 201 having the through holes 104 which are coated with the insulating film 105.

Subsequently, referring to FIG. 3B, the semiconductor chip 101 is placed on the island 201 while aligning the electrodes 102 of the semiconductor chip 101 with the through holes 104 of the island 201. Then, the semiconductor chip 101 is fixed to the island 201 by the adhesive tape 106. After the semiconductor chip 101 is mounted on the island 201, as shown in FIG. 3C, the semiconductor chip 101 is sealed with the sealing resin 107.

Next, as shown in FIG. 3D, the respective through holes 104 are filled with solder to form the solder balls 108 which are electrically connected to the electrodes 102 through the through holes 104. Thereafter, the packages are screened and then unwanted portions of the lead frame 103 are cut away to complete the plastic BGA package as shown in FIG. 3E.

As described above, according to the present invention, conventional production line for lead frames can be shared, resulting in reduced cost for a plastic BGA package. Further, since the lead frame is used rather than the multi-layer substrate, the cost is further reduced.

What is claimed is:

1. A method for producing a semiconductor chip package including a semiconductor chip having a plurality of electrodes arrayed in a predetermined pattern on one side thereof, comprising the steps of:

insulating a metal film having an island portion where a plurality of through holes are formed corresponding to the electrodes of the semiconductor chip, respectively, such that at least the island portion having the through holes therein is insulated;

bonding the semiconductor chip to one side of the island portion such that the electrodes of the semiconductor chip are aligned with the through holes of the island portion, respectively; and forming a plurality of terminals on the other side of the island portion, the terminals being connected to the electrodes of the semiconductor chip through the through holes of the island portion, respectively.

2. The method according to claim 1, wherein at least the island portion having the through holes therein is coated with insulating material.

3. The method according to claim 1, wherein a plurality of island portions each having the through holes are formed in the metal film.

4. The method according to claim 1, wherein the island portion is supported by a plurality of supporting portions.

5. The method according to claim 3, wherein each of the island portions is supported by a plurality of supporting portions.

6. The method according to claim 1, wherein each of the terminals is a terminal ball protruding from a surface of the other side of the island portion, the terminal ball being connected to a corresponding electrode of the semiconductor chip through a corresponding through hole.

7. A method for producing a semiconductor chip package including a semiconductor chip having a plurality of electrodes arrayed in a predetermined pattern on one side thereof, comprising the steps of:

preparing a lead frame having an island portion where a plurality of through holes are formed corresponding to the electrodes of the semiconductor chip, respectively;

forming an insulating film on at least the island portion having the through holes therein;

fixing the semiconductor chip to one side of the island portion of the lead frame through an adhesive layer such that the electrodes of the semiconductor chip are aligned with the through holes of the island portion, respectively;

sealing the semiconductor chip with sealing resin; and forming a plurality of terminals on the other side of the island portion, the terminals being connected to the electrodes of the semiconductor chip through the through holes of the island portion, respectively.

8. The method according to claim 7, wherein a plurality of island portions each having the through holes are formed in a metal film.

9. The method according to claim 8, wherein the adhesive layer is formed by placing an adhesive tape on each of the island portions.

10. The method according to claim 8, wherein each of the island portions is supported by a plurality of supporting portions.

11. The method according to claim 10, further comprising the step of removing a needless portion from each supporting portion.

12. The method according to claim 7, wherein each of the terminals is a solder ball protruding from a surface of the other side of the island portion, the solder ball being connected to a corresponding electrode of the semiconductor chip through a corresponding through hole.

13. The method according to claim 12, wherein the semiconductor chip package is a BGA (ball grid array) package.

* * * * *